US007890901B2

(12) United States Patent
Gemmeke et al.

(10) Patent No.: US 7,890,901 B2
(45) Date of Patent: Feb. 15, 2011

(54) METHOD AND SYSTEM FOR VERIFYING THE EQUIVALENCE OF DIGITAL CIRCUITS

(75) Inventors: Tobias Gemmeke, Boeblingen (DE); Jens Leenstra, Bondorf (DE); Nicolas Maeding, Holzgerlingen (DE); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 11/684,899

(22) Filed: Mar. 12, 2007

(65) Prior Publication Data

US 2007/0226664 A1    Sep. 27, 2007

(30) Foreign Application Priority Data

Mar. 24, 2006  (EP)  ................................. 06111683

(51) Int. Cl.
 *G06F 17/50* (2006.01)
 *G06F 9/45* (2006.01)
(52) U.S. Cl. ......................... 716/5; 716/2; 716/4; 716/6
(58) Field of Classification Search .................. 716/2, 716/4–6
 See application file for complete search history.

(56) References Cited

U.S. PATENT DOCUMENTS

| 7,287,235 | B1 * | 10/2007 | Hasteer et al. | ................. | 716/2 |
| 2005/0289498 | A1 * | 12/2005 | Sawkar et al. | ................. | 716/18 |
| 2007/0033551 | A1 * | 2/2007 | Greaves et al. | ................. | 716/3 |
| 2007/0220461 | A1 * | 9/2007 | Baumgartner et al. | .......... | 716/5 |

OTHER PUBLICATIONS

Ara et al.; "A Proposal for Transaction-Level Verification with Component Wrapper Language"; 2003; Cental Research Laboratory, Hitachi, Ltd.; pp. 1-6.*
Kong et al.; "Refinement-Based Formal Verification of Asynchronous Wrappers for Independently Clocked Domains in Systems on Chip"; 2001; Microelectronics and Computer Systems Laboratory, McGill University; pp. 1-16.*
J.M. Ludden et al., "Functional Verification of the POWER4 Microprocessor and POWER4 Multiprocessor Systems", IBM J. Res. & Dev., vol. 46, No. 1, Jan. 2002, pp. 53-76.
Alexey Kupriyanov et al., "High-Speed Event-Driven RTL Compiled Simulation", Proc. of the 4th Int. Workshop on Computer Systems: Architectures, Modeling, and Simulation, Jul. 2004, vol. 3133 of Lecture Notes in Computer Science, pp. 519-529.

(Continued)

*Primary Examiner*—Sun J Lin
*Assistant Examiner*—Suresh Memula
(74) *Attorney, Agent, or Firm*—H. Daniel Schnurmann

(57) ABSTRACT

The automatic verification of designs of digital circuits for their equivalence, wherein logic designs implemented in different hardware description languages (HDLs) and different design methodologies are compared. The designs (Code A, Code B) are modified by adding special wrappers (Wrapper A, Wrapper B), and used to equalize the timing of pairs of selected input signals and selected output signals of the logic designs. The wrappers drive certain signals of the designs that are not relevant for actual comparison, such signals including clock signals, clock control signals, scan-path signals, scan-path control signals, and reset signals. In a preferred embodiment, HDL descriptions of logic designs are analyzed. Based on this analysis, the wrappers are implemented as changes to the HDL descriptions. In another embodiment, RTL and/or gate-level netlists are analyzed and modified.

15 Claims, 6 Drawing Sheets

OTHER PUBLICATIONS

R.M. Gott et al., "Functional Formal Verification on Designs of pSeries Microprocessors and Communication Subsystems", IBM J. Res. & Dev., vol. 49, No. 4/5, Jul./Sep. 2005, pp. 565-580.

Hari Mony et al., "Scalable Automated Verification via Expert-System Guided Transformations", Proceedings of Formal Methods in Computer-Aided Design, 5th International Conference, FMCAD 2004, pp. 1-15.

Hari Mony et al., "Exploiting Suspected Redundancy without Proving It", Proceedings of the 2005 Design Automation Conference, pp. 463-466.

H.W. Anderson et al., "Configurable System Simulation Model Build Comprising Packaging Design Data", IBM J. Res & Dev., vol. 48, No. 3/4, May/Jul. 2004, pp. 367-378.

* cited by examiner

METHOD AND SYSTEM FOR VERIFYING THE EQUIVALENCE OF DIGITAL CIRCUITS

BACKGROUND OF THE INVENTION

The present invention relates to a method and a system for verifying the equivalence of digital circuit designs.

Logic Design Verification

Digital logic circuits typically implement a logic function that represents the core of any computer or processing unit. Thus, before a logic design is constructed in real hardware, it must be tested, and the proper operation thereof has to be verified against the design specification. This task is called functional verification of a design under test (DUT) and is described in a paper by J. M. Ludden et al., entitled "Functional verification of the POWER4 microprocessor and POWER4 multiprocessor systems", IBM Journal of Research and Development, Vol. 46, No. 1, January 2002.

Functional verification is commonly performed at various levels of abstraction of the hardware design, e.g., a switch level and a transistor level. The switch level typically includes active circuit elements (e.g., transistors) and passive circuit elements (e.g., resistors, capacitors, and inductors), whereas the transistor level includes only active devices.

In one step of the functional verification process, the hardware logic design is represented by a so-called register-transfer level (RTL) netlist, or netlist. Register transfers take place during the execution of each hardware cycle: input values are read from a set of storage elements (registers, memory cells, etc.); a computation is performed on these values; and the result is assigned to a set of storage elements. In addition to RTL netlists, gate-level netlists also exist. The gate-level is usually the result of logic synthesis methods that replace complex elements (e.g., a register) by a circuit consisting of a number of simpler elements, such as Boolean gates and latches. Direct hardware implementations in a dedicated technology are associated to such simple elements.

The netlist can be generated from a high-level description of the hardware using a standard hardware description language (HDL), such as VHDL or Verilog. Logic simulation systems use the netlist to simulate the behaviour of a DUT for a given set of input signal values. The netlist can be treated as a directed graph structure consisting of simple building blocks as nodes, and signals as connecting arcs, as described in an article by Kupriyanov et al., entitled "High Speed Event-Driven RTL Compiled Simulation", Proc. of the $4^{TH}$ Int. Workshop on Computer Systems: Architectures, Modeling, and Simulation, 2004. The building blocks are often called boxes, and the signals, nets. Among the simple building blocks are Boolean gates, registers, arrays, latches, and black boxes representing special logical functions. In most netlist representations, the boxes and nets have a unique name by which they are identified.

Sequential logic is a type of logic circuit whose output depends not only on the present input but also on the history of the input. This is in contrast to combinatorial logic, whose output is a function of the present input. Alternatively, sequential logic stores data while combinatorial logic does not.

Functional Formal Verification (FFV)

Assuming a simple illustrative digital circuit having a plurality of 16 input signals, a plurality of 216 different input signal values exist that are to be tested for the correct operation of the circuit. However, today's hardware designs are much more complex. Even single sections of a hardware design may comprise hundreds or thousands of input signal values. In addition to the input signals, the states of internal elements of the digital circuit need to be taken into account. This enormous space of input signal values and internal states cannot be totally verified by logic simulation. Instead, regression runs of logic simulations using randomly generated values for the input signals of the DUT have been advantageously used.

A special verification technique that addresses the complete input signal value space for a DUT is referred to as functional formal verification (FFV). However, the FFV of the DUT at the register-transfer level is inherently difficult to achieve when using automated methods. Many automated functional formal verification methods are based on algorithms using Binary Decision Diagrams (BDDs) to represent the DUT, wherein a temporal logic formula is verified for a given hardware logic design. Systems implementing these methods are referred to as a (symbolic) model checker. Model checkers benefit from the fact that an RTL netlist can be represented as a finite state machine for which the complete finite state space is verified.

A temporal logic formula allows specifying the behaviour of a system over time, for example, to achieve logic design verification. Computation Tree Logic can be used to specify the signal value of a signal at predetermined discrete points in time (cycles), e.g., a signal has a value of 1 in the next cycle; a 0 in all following cycles; a 1 in at least one of the following cycles, etc. If the model checker finds a specific combination of signal values for the inputs of the netlist for which a temporal logic formula is not fulfilled, it then generates a counterexample. A counterexample is defined as a list of signals and corresponding values of either 0 or 1 in certain cycles. A model checker delivers the counterexample within a minimal number of cycles, such that the temporal logic formula is not fulfilled by the DUT.

Other automated functional formal verifications are based on algorithms that use conjunctive normal forms (CNF) to represent the hardware logic design and check whether a CNF can be satisfied (SAT) for a given hardware logic design. Systems implementing these methods are called SAT checkers. Except for special cases, attempts to formally verify a DUT result in either memory (BDD-based algorithms) or runtime (SAT-based algorithms) explosion, commonly referred to as state-space explosions (in reference to the state space of the finite state machine implemented by a DUT). Therefore, repeated attempts have been made to reduce the state space of a logic design by applying automatic transformations to the logic design. Known methods include retiming and phase-abstraction that assume logic circuits with one or more clock phases, but keeping the same type of storage elements, e.g., only edge-triggered latches or level-sensitive latches. The retiming moves storage elements within the combinatorial logic, even removes storage elements in order to reduce the state space of the logic design. However, the output signals do not change. Phase-abstraction converts storage elements of all but a single clock phase to wires, and converts the remaining storage elements into registers. For example, L1 latches are converted to wires, and L2 latches are converted to registers determined to be "hot-clocked" (clocked by an always-active clock rather than by an oscillating clock) at every clock cycle.

Another approach employs semiformal verification, a hybrid type of design exploration that moves iteratively between random simulation and a resource-bounded exhaustive search through the state space. In an article by R. M. Gott et al. entitled "Functional formal verification on designs of pSeries microprocessors and communication subsystems", IBM J. Res. & Dev., Vol. 49, No. 4/5, 2005, are described several experiments and results for applying FFV to the design of a processor and a communication subsystem.

Design Reuse

It is well-known that the time needed to design digital circuits is a critical issue in a modern chip design. Therefore, to reuse existing hardware designs is frequently proposed as a solution to reduce this effort and reduce the time to develop a new hardware design. A typical case is to reuse an existing design that was implemented in a first semiconductor technology for its implementation in a second semiconductor technology, e.g., an improved version of the first semiconductor technology. Usually, the existing design needs to be modified for the second semiconductor technology. This step is called porting an existing design to the second semiconductor technology.

Another approach is the reuse components of a particular design for a new design. In this case, the design of existing components needs to be adapted to the new design. This step is called porting components to a new design. In such an instance, a problem often occurs when an existing and new design assume different design methodologies and a different tool set for creating the hardware. For example, a problematic case may include the use of different HDLs, such as VHDL and Verilog. Other examples of potential differences are different latch types (e.g., edge triggered vs. level sensitive latches), different clock configurations, different reset configurations, and the like.

Among other potential adaptations required when porting existing logic designs, the following typical problems can occur:

a logic function needs to be moved from one pipeline stage to the next;
the timing behaviour needs to be changed;
asynchronous resets are not allowed in the new logic design but are used in the existing logic design;
clock control signals need to be changed; and
scan path chains and associated control signals require altering.

A simple problematic example is given by the following two HDL code fragments, one being Verilog code, the other, VHDL code:

```
-- VERILOG: std. asic code
always @(posedge CLK)
    B <= A;
end;
-- VHDL: IBM uproc register
port map (
    nclk => CLK,
    act => act,
    sg => int_sg,
    thold_b => reg_thold_b,
    scin => int_scan(0),
    scout=> int_scan(1),
    din => A,
    dout => C
);
```

In the VHDL code fragment the signals act, sg, thold_b, scin, and scout are purely dedicated to clock gating and scan chains without having equivalent signals in the Verilog code fragment.

Equivalence Checking

Due to potential design errors that can be introduced in the porting step, it is usually verified in an equivalence checking step of the functional verification of a DUT, that two logic designs are equivalent. Various types of equivalence can be defined for two logic designs. Specifically, for the porting of a logic design, the cycle-accurate equivalence needs to be verified, wherein when starting from reset, a first logic design produces identical outputs as a second design for every clock cycle upon applying equal inputs. In the remainder equivalence of digital circuits means, cycle-accurate equivalence and equivalence checking is the process that verifies the equivalence.

For the equivalence checking of two logic designs comprising combinatorial logic only, powerful tools are available on the market. These tools are referred to as Boolean equivalence checkers and are mainly used to verify that two gate-level netlists are equivalent, where the gate-level netlists are the result from automatic logic design transformation steps of a logic design at the RTL.

A common case is the logic synthesis step that automatically transforms the logic design from an RTL description to a gate-level netlist. This automatic transformation is related to constraints of the semiconductor technology used to implement the logic design. Following logic synthesis, the resulting gate-level netlist is verified to determine whether it is equivalent to the RTL description. Potentially, a Boolean equivalence checker automatically transforms the RTL netlist to an internal gate-level netlist. Since it is assumed that the logic synthesis does not modify the storage elements of the RTL netlist, only the combinatorial logic part of the netlists needs to be verified. Combinatorial logic parts can be extracted automatically from the netlists by the Boolean equivalence checker.

Boolean equivalence checkers perform the equivalence checking such that they combine the two netlists in a single gate-level netlist with the same set of inputs, each of which is verified by formal verification techniques, i.e., every possible combination of inputs is verified that the corresponding outputs of the two designs are equal. Often Boolean equivalence checkers are implemented using BDDs.

Available tools which can perform the equivalence checking of two logic designs at the RTL that includes sequential logic circuits face the problem of a potentially huge state space of a finite state machine represented by the logic designs. This problem either restricts the verification coverage that can be achieved or it prevents the use of the so-called sequential equivalence checker tools in many real-world porting scenarios. Many sequential equivalence checker tools are based on FFV tools, e.g., model checkers. But also semiformal verification methods can be used to implement sequential equivalence checkers.

Boolean and sequential equivalence checking methods for logic designs used for real-world logic designs assume an equal set of inputs and outputs of the two logic designs that are compared. However, as described above, this is often not the case for logic designs ported from one semiconductor node to another and for reusing logic design components. Therefore, there is a need in industry for existing formal verification methods that apply to sequential equivalence checking of digital circuit designs.

OBJECTS AND SUMMARY OF THE INVENTION

It is therefore an object of the present invention to provide a method and a system for verifying the equivalence of digital circuits According to one aspect of the invention, wrappers are provided for design representations of the digital circuits to be compared. The wrappers allow the use of existing verification methods such as FFV, semiformal verification, simulation, or combinations thereof. For the verification, pairs of selected input signals of both design representations are set to equal values. The values of pairs of selected output signals of both design representations are compared for equality.

In a preferred embodiment of the invention, the wrappers are used to equalize the timing of the pairs of selected input signals and selected output signals of the design representations. The selection of these signals can be done using additional configuration data and/or be based on specific attributes of these signals. In another embodiment, equalizing the timing of the selected signals is performed by a verification tool instead. An example for such a tool is a model checker that is modified to implement the method in accordance to this invention.

The wrappers further drive certain signals of the design representations that are not relevant for actual comparison. Examples of such signals are clock signals, clock control signals, scan-path signals, scan-path control signals, and reset signals. The detection of these signals can be performed automatically based on the special attributes of the signals and/or can be based on additional configuration data.

In another preferred embodiment, HDL descriptions of the logic designs are analysed. Based on this analysis, wrappers are implemented as changes to these HDL descriptions. In yet another embodiment, RTL and/or gate-level netlists are analysed and modified. The invention enables an automatic verification of the designs of digital circuits for determine their equivalence. More specifically, logic designs implemented in different HDLs and with different design methodologies can be compared.

BRIEF DESCRIPTION OF THE DRAWINGS

The present invention and its advantages are now described in conjunction with the accompanying drawings.

DETAILED DESCRIPTION

Figure 1:
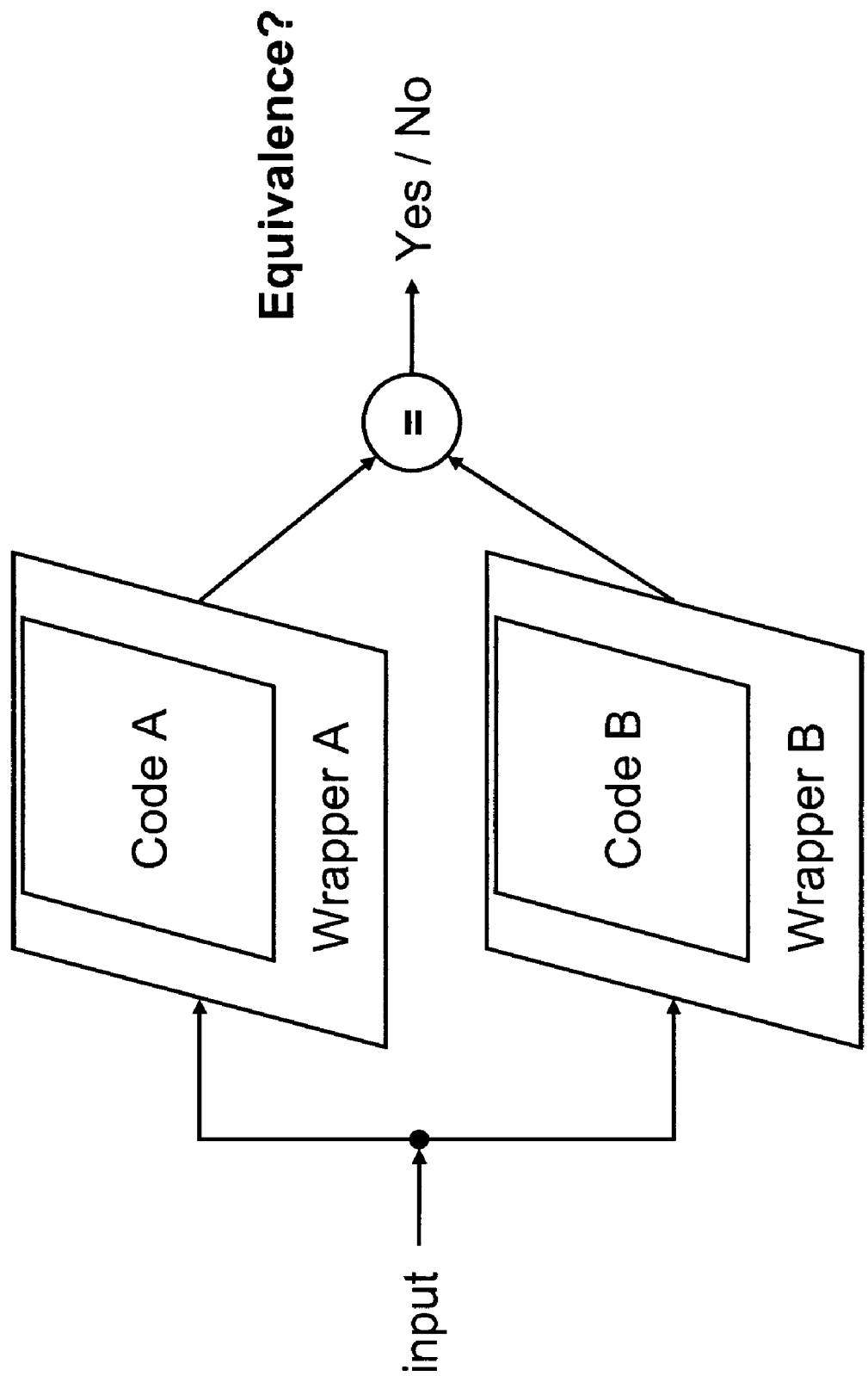
FIG. 1 is a schematic block diagram illustrating two designs in accordance to be checked for equivalency.

Referring to FIG. 1, there is shown is a block diagram of two designs represented by two HDL logic implementations (Code A and Code B) that serve as inputs to the system of the present invention, and which are to be compared for equivalence for a given input set.

Figure 2:
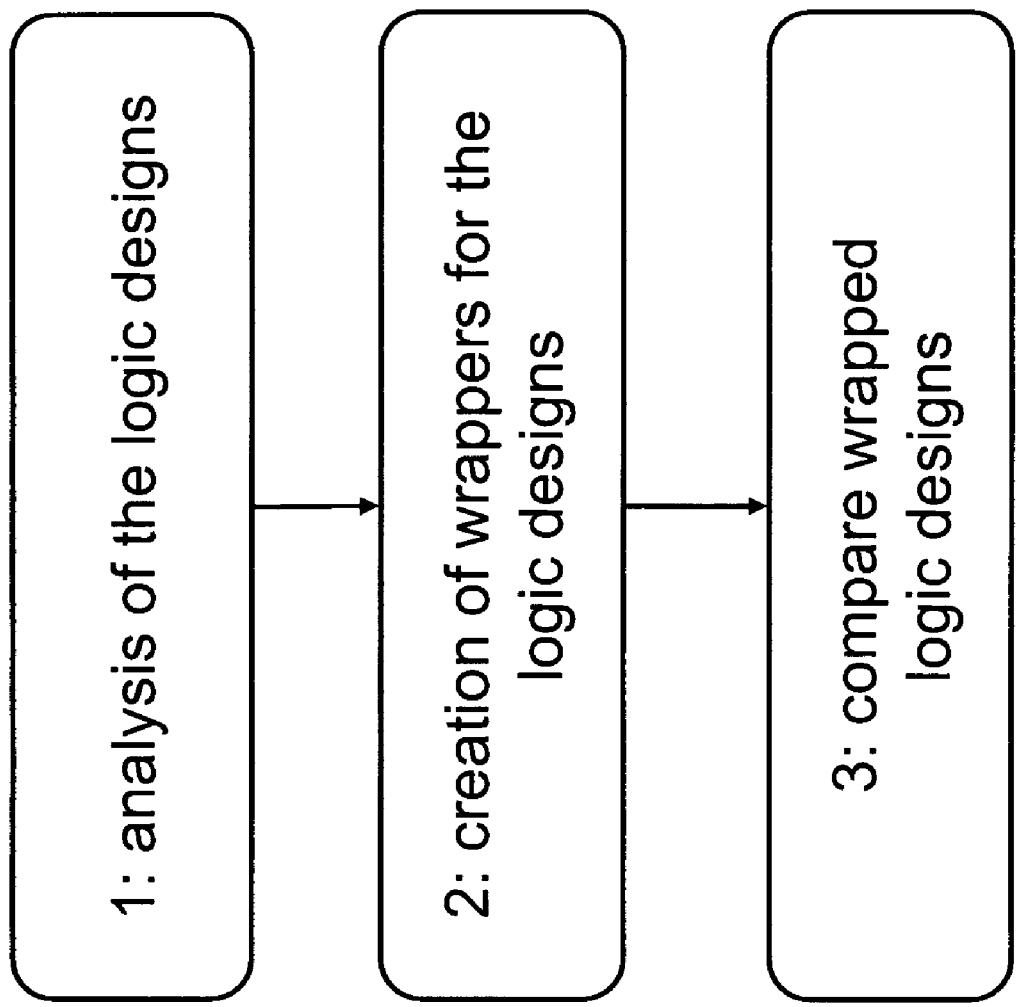
FIG. 2 is a flow chart describing a preferred embodiment of the present invention.

Referring to FIG. 2, there is shown a flow chart describing a preferred embodiment of the present invention. In step 1, two designs in need to be compared are analysed. This step is referred to as the analysis step. In step 2, a wrapper is constructed for each design based on the analysis results encapsulating the design. This step is referred to as the wrapper creation step. In step 3, the resulting two modified designs are compared for sequential equivalence. This step is referred to as the verification step. The verification step uses existing verification methods and tools known in the art. Their use is enabled by special wrappers created during the wrapper creation step.

The analysis and wrapper creation steps are performed at the HDL level. The HDL implementation of the logic design is transformed into an HDL implementation of the modified logic design, where a wrapper encapsulates the logic design. The HDL for the given logic design implementation does not change during the transformation step. The analysis step is based on lexical analysis methods assuming certain conventions for the implemented logic design. It is also possible to perform the analysis step without implicit assumptions about conventions for the implemented logic designs which directly analyze the functionality of the logic design. However, it requires substantial implementation efforts at the HDL level caused by the complexity of the HDL.

The disadvantage of using the HDL level is that at least some adaptations are required for every HDL to be supported. However, there are several advantages for performing the analysis and wrapper creation steps at that level. For example, an HDL implementation is human readable which allows manual verification and modification of the results from the transformation step. It is possible to derive additional information based on coding conventions which encompasses a variety of possibilities for attaching special information to functional units of the logic design. Usually, coding conventions are already used for the development process steps, like model build for logic simulation, actual logic simulation, logic synthesis, and timing analysis.

Typical examples for elements of coding conventions are comments associated with the HDL code that can be interpreted according to dedicated tools, postfix or prefix naming conventions for VHDL entities (e.g. to introduce a relationship between a latch/register type and its functionality), dedicated attributes in the HDL code (attributes are elements of an HDL that do not specify a logical function but can be interpreted by dedicated tools), prefix and postfix naming conventions for signal names (e.g. to identify clock signals), special pre-processor directives (e.g., referred to pragma attributes) and information regarding hierarchies of the entities.

In one embodiment of the invention, the analysis and wrapper creation steps can be implemented as a computer program using PERL, a programming language known for its easy usable support for regular expressions and string manipulations. It is also possible to extend existing compiler, pre-processing, simulator or verification tools accordingly or to off-load some functionality to separate tools, e.g., using a compiler or pre-processor for the pre-processing steps only.

The following VHDL code fragment for a simple hardware element, a so-called macro with file name macro.vhdl, will be used as an example to demonstrate the transformation at the HDL in the wrapper creation step:

```
-- macro.vhdl
library IEEE;
library register;
entity macro is port (
    clk    : in std_ulogic;
    data_in:    in std_ulogic;
    bus_in:     in std_ulogic_vector(0 to 31),
    data_out: out std_ulogic;
    bus_out:    out std_ulogic_vector(0 to 31)
    );
end macro;
architecture macro of macro is
begin
i0: entity sub_macro
    port map (
        signalA_in => data_in,
        signalA_out => data_out,
```

```
);
reg_0 : entity register.reg_posedge
    generic map (width => 32, offset => 0)
    port map (clk => clk,
        data_in => bus_in,
            data_out=> bus_out
        );
end macro;
```

For the library "register", no further specification will be given. Instead of VHDL, any other HDL implementation can be used, e.g., Verilog. More specifically, two logic designs in need to be compared for sequential equivalence can be implemented using different HDLs.

For the lexical analysis, certain conventional VHDL pre-processing and compilation steps need to be performed in order to include all the sub-hierarchies (by processing referenced files, libraries, etc.), to expand any pre-processor directives, and map all the constants to their concrete values.

A VHDL compiler (possibly in conjunction with other tools) can be used to create an RTL (and/or gate level) netlist from the example file macro.vhdl. Rather than creating the wrapper at the HDL level, it is also possible to create a modified netlist. The netlist provided by the VHDL compiler inherits many of the coding conventions from the HDL level (e.g., naming conventions). However, it is simpler to implement the analysis step without making assumptions regarding the conventions used for the logic design.

One advantage of performing the analysis and wrapper creation steps on a netlist is that they are independent of the HDL used to create the netlist. Therefore, all the HDLs can be supported directly for which an automated method exists and which translates a given logic design HDL implementation to the supported netlist format. Another advantage is that the netlists can be optimized using well-known methods, preferably, in that redundancies can be removed and complex structures be replaced by equivalent structures of reduced complexity. This simplifies the analysis, wrapper creation, and verification steps.

Global inputs are signals that have a sink but no source, and global outputs are signals that have a source but no sink in the graph structure represented by a netlist. Among the global inputs and outputs, a subset is preferably defined for the primary inputs and outputs. Primary inputs (PIs) and primary outputs (POs) are used to define interfaces to other components, e.g., pins of an integrated circuit or inputs and outputs of a design macro. At the HDL level, PIs and POs are typically defined in a header statement with keywords showing the pin direction, and the type and width of the signal. The width of a signal is potentially derivable from its type definition.

For the wrapper generation, specific latches and registers called relevant latches/registers need to be determined. Relevant latches/registers for wrapper creation are latches/registers that depend on a PI or for which a PO depends on the latch; i.e., latches for which a path to a PI or PO exists in the graph structure represented by the netlist. For example, the relevant latches/registers of a netlist are preferably determined by a depth first or breadth first search starting on each latch that tests if a PI or PO can be reached via a path in the graph (possibly by colouring the nodes traversed). The modification steps to a netlist can be performed using various well-known automated methods, such as methods performing graph manipulations. For these methods, no change to the original design description in a HDL is required.

For relevant latches/registers, their type (e.g., edge-triggered or level-sensitive) and clock phase needs to be determined. This information is usually already available as it is needed for other steps of the design process, e.g., the timing analysis of the netlist. The type and clock phase can be stored as a special attribute in the netlist, or be derived from the name of the latch assuming a special naming convention (e.g., a dedicated prefix or postfix string).

Another option is to use additional user-specified input lists in a file or made available via a graphic user interface mask that provides the required information or complements the information contained in the netlist. For the present example, macro.vhdl lists information usually extracted by lexical analysis methods can also be provided or complemented by manual user input or data supplied by other tools. Typically, such a list is already available, as it is required for other steps of the development process, such as model building for the logic simulation, the actual logic simulation or other verification steps. These lists are also predefined for a certain semiconductor node and stored in a library. Based on regular expressions, such a list can be further compressed by combining related signals and latches.

A self-explanatory input list consisting of a file named example_input.data is now illustrated showing the content within the macro.vhdl file:

```
-- example_input.data
data_in     in      1   data_out
bus_in      in      32  reg_posedge
data_out    out     1   data_in
bus_out     out     32  reg_posedge
```

In the preferred embodiment of the invention, relevant latches are detected directly at the HDL level using lexical analysis methods. VHDL allows specifying structural and behavioral descriptions. For structural descriptions, names of libraries and VHDL language entities are preferably used to detect a relevant latch/register. The following two VHDL code segments having file names example_a.vhdl (example A) and example_b.vhdl (example B) show their behavioral descriptions:

```
-- example_a.vhdl
library IEEE;
use IEEE.std_logic_1164.all;
entity example_a is port (
    xd: in std_logic;
    xclk: in std_logic;
    xq: out std_logic
    );
end example_a;
architecture example_a of example_a is
begin
    process begin
        wait until xclk = '1';
            xq <= xd;
        end process;
end example_a;
-- example_b.vhdl
library IEEE;
use IEEE.std_logic_1164.all;
entity example_b is port (
    xd: in std_logic;
    xclk: in std_logic;
    xq: out std_logic
    );
end example_b;
architecture example_b of example_b is
```

-continued

```
begin
  process (clk) begin
    if xclk'event and xclk = '1' then
      xq <= xd;
    end if;
  end process;
end example_b;
```

The following VHDL code fragment with file name example_c.vhdl is an example (example C) of the structural description:

```
-- example_c.vhdl
library IEEE;
use IEEE.std_logic_1164.all;
entity example is port (
  xd: in std_logic;
  xclk: in std_logic;
  xq: out std_logic
  );
end example;
architecture example of example is
begin
  inst: d_ff port map (
    d => xd,
    clk => xclk,
    q => xq
    );
end example;
```

For all three examples A, B, and C, it is required to extract the following information from the VHDL entity:
a) input signals: xd, xclk
b) (delayed) output signals: xclk
c) type of the latch/registers: a positive edge-triggered latch
d) corresponding clock signal: xclk In all the three examples A, B, and C, the signals are binary; however, the illustrative example macro.vhdl also incorporates binary vectors therein, e.g., std_ulogic_vector (0 to 31).

The information extracted by the lexical analysis methods determines the clocking configuration of the VHDL macro. A clocking configuration describes the delay for the signal propagation in a clock cycle. It is determined by types of the relevant latches and registers, their active edges or phases, the clock signal or the frequency in relation to a clock reference, other clock control signals (e.g., clock enable signals), and (a) synchronous resets.

Figure 3:
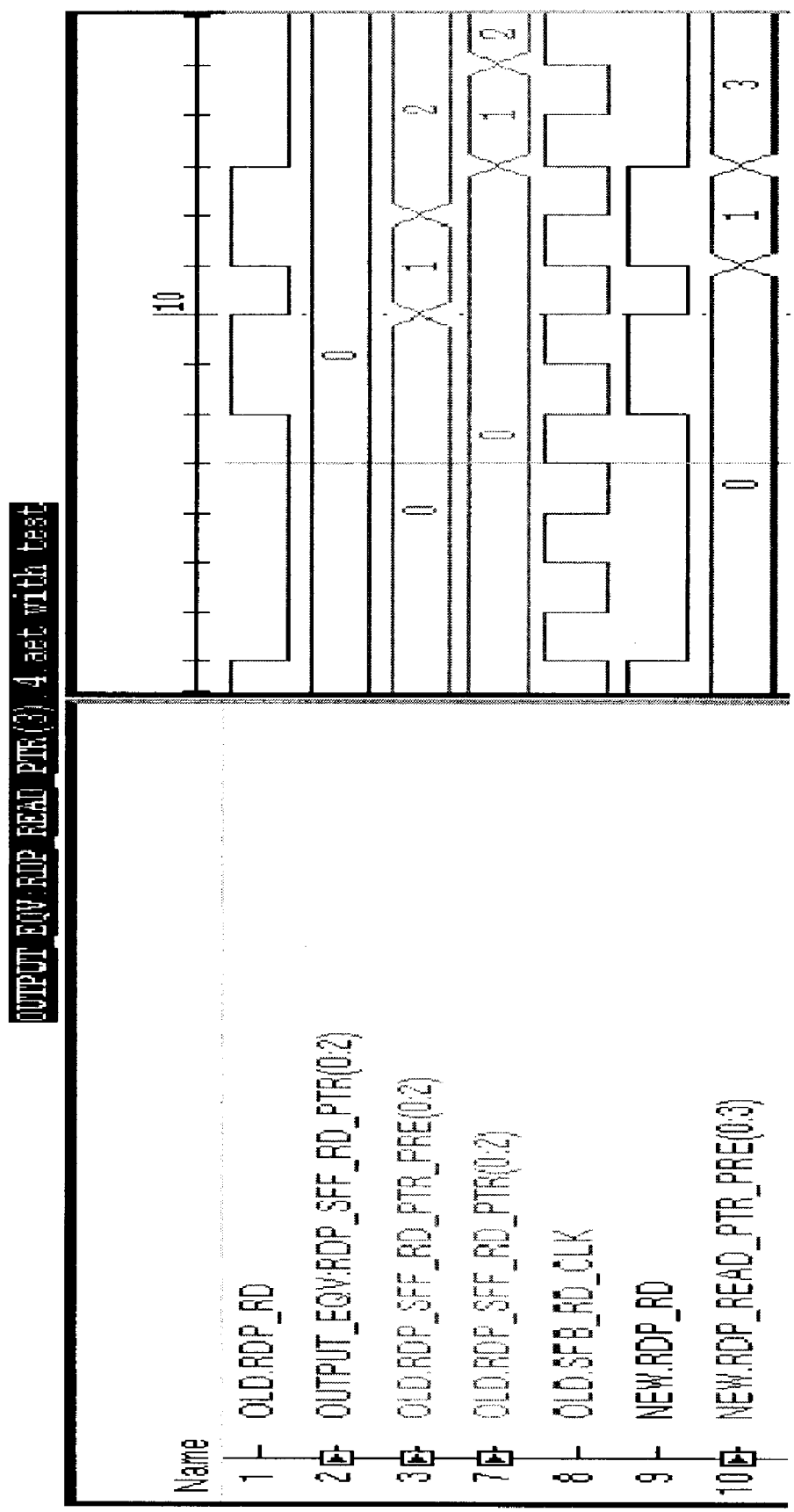
FIG. 3 is a timing diagram applicable to the values of logical signals.

FIG. 3 is a timing diagram of selected signals of two logic designs OLD and NEW. The signal RDP_RD is part of both designs and is an input to a counter which increments by 1 its output signal vector RDP_SFF_RD_PTR_PRE when its input signal is at high. The design OLD includes edge-triggered latches; therefore, OLD.RDP_SFF_RD_PTR_PRE already changes with the falling edge OLD.SFB_RD_CLK in cycles 10 and 12. The design NEW uses a level-sensitive register instead, which propagates values in two cycles. Hence, NEW.RDP_SFF_RD_PTR_PRE changes during cycles 11 and 13.

Figure 4:
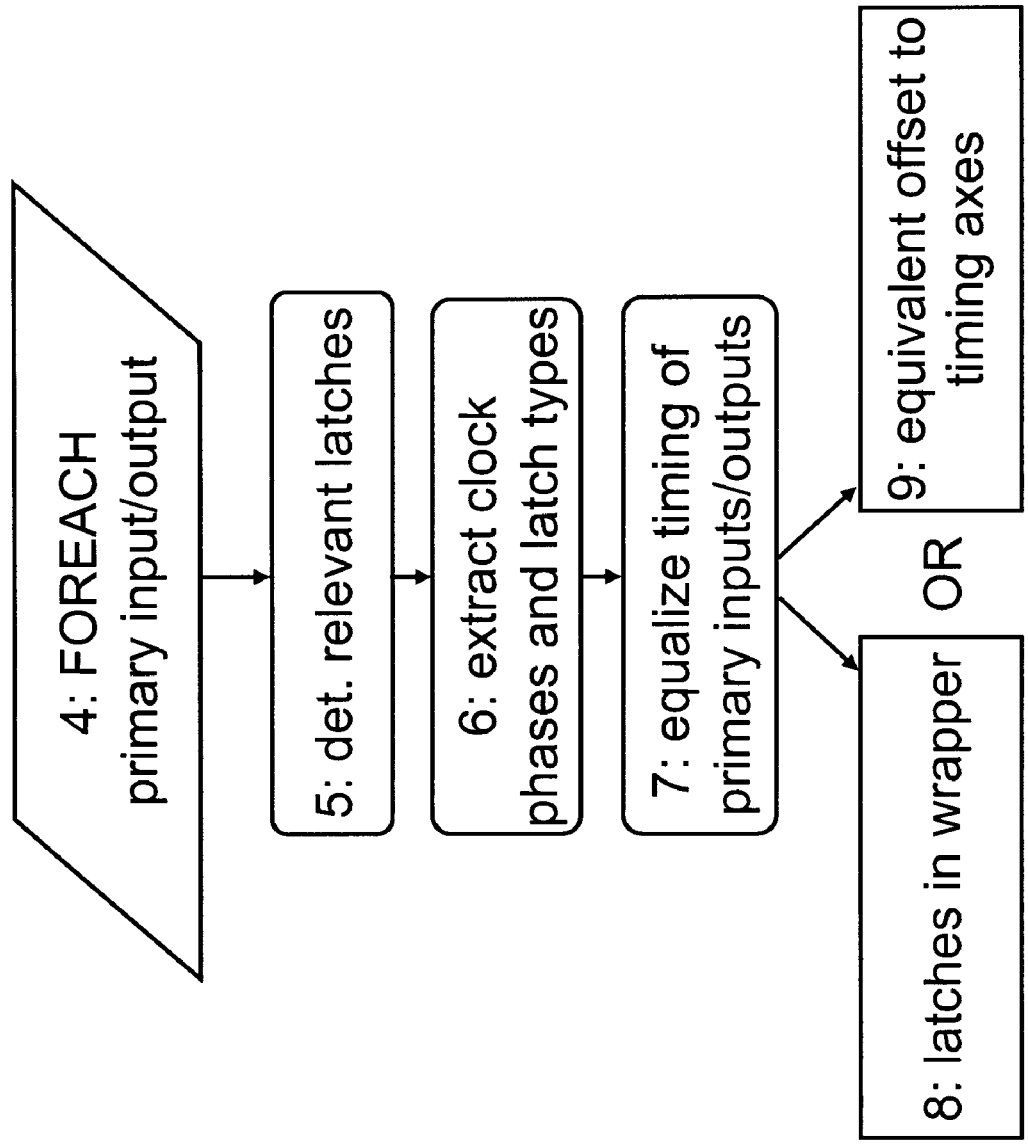
FIG. 4 is a flow chart of another embodiment of the present invention.

In order to resolve problems related to the timing behavior, the clocking configuration information is used in the wrapper creation (step 2) to equalize the PIs and POs timings of both logic designs. An illustrative implementation of the timing equalizing step for edge-triggered and level-sensitive latches/registers is shown in FIG. 4. In step 4, each PI and PO loops over, and for each PI and PO, the relevant latches are determined (step 5). In step 6, the clock phases and latch types are determined for the relevant latches. In step 7, the timing of the PIs and POs affected is equalized. Various options are possible to achieve the same results. For example, in step 8, by inserting additional latches/registers in the wrappers.

Another solution is shown in step 9, wherein an equivalent offset to the timing axis is achieved. For the timing diagram illustrated in FIG. 3, the timing behaviour of the model OLD needs to be shifted by one cycle, leaving the timing behaviour of the model NEW without being shifted, The same effect is achieved when the timing behaviour of the model OLD is shifted by 3 cycles, and the timing behaviour of the model NEW is concurrently shifted by 2 cycles. A FFV tool, such as a model checker, can be extended to support this method.

An example implementation for step 8 uses the following mapping table:

| Latch Type | Level-sensitive | Positive Edge | Negative Edge |
|---|---|---|---|
| Level-sensitive | X | PI: —<br>PO: L1/L2 | PI: L1/L2 or L2/L1<br>PO: — |
| Positive Edge | | X | PI: L1/L2 or L2/L1<br>PO: L1/L2 or L2/L1 |
| Negative Edge | | | X |

The rows and columns, respectively, belong to one of the logic designs. The mapping table reads as follows:

Depending on the types of pair of latches/registers that feed the pair of POs (or is fed by the pair of PIs), additional latches/registers are inserted in the wrapper. The 'X's indicate the trivial case where no latches/registers need to be inserted. The L1/L2 and L2/L1 latches are inserted in both logic designs depending on the combination of the type of latches in one model versus the type of latches in the other logic design. In case of relevant POs, the input d of L1/L2 or L2/L1 latches is connected to the POs in both logic designs.

Figure 5:
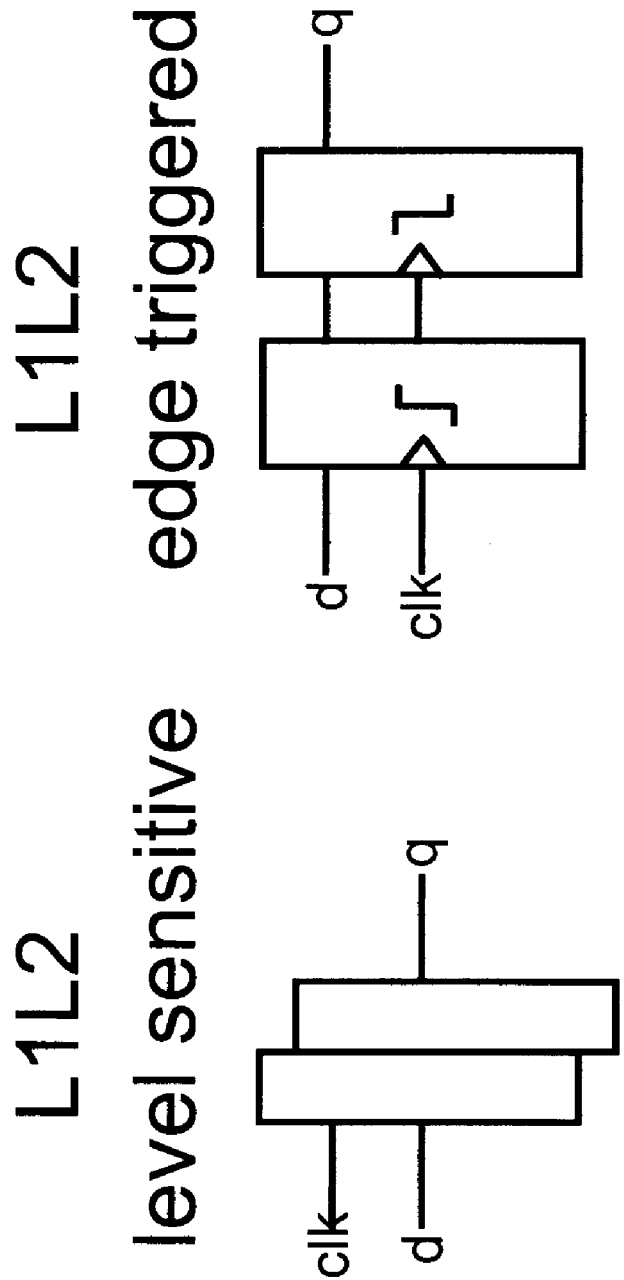
FIG. 5 is a schematic block diagram of latches.

FIG. 5 shows two possible implementations of the L1/L2 latches, a level-sensitive and an edge-triggered implementation. In case of relevant PIs, the output q of the L1/L2 latches is connected to the PIs of both logic designs. A clock input is always connected to a clock signal. Instead of the L1/L2 or L2/L1 latches, a single level-sensitive latch can be advantageously used. The latch mapping table lists typical cases only. For special cases, one skilled in the art will readily appreciate how to extend the table, as needed. For example, if an input signal is connected to an output signal of a latch, then in the case level-sensitive vs. positive edge-triggered latch the signal needs to be extended with an L1/L2 stage.

The wrapper needs to include a method for clock and clock signal generation. This can be achieved by instantiating a suitable macro from the library or by an explicit description of a state machine. The state machine models the behavior of the corresponding clocking configuration. For the example macro.vhdl, the state machine can be implemented by a flip-flop, which alters its state in every cycle. This flip-flop can be used to create a reference clock signal. Thus, clock signals and clock control signals do not appear as PIs in the wrapper.

The wrapper also needs to feed the control signals related to scan chains, including other control signals, such as reset signals, since they may differ from one logic design to the other or they may not even be available in any of the logic designs.

Figure 6:
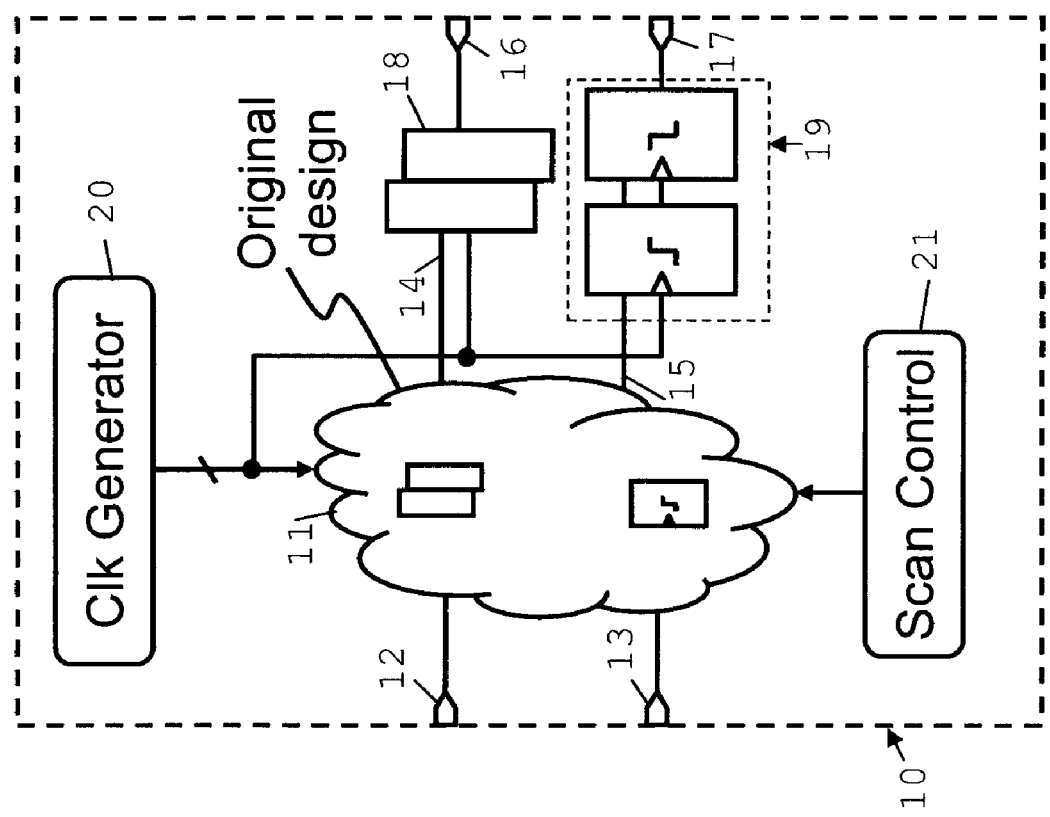
FIG. 6 is a schematic block diagram of a wrapper in accordance with the invention.

FIG. 6 shows wrapper 10 and logic design 11. The logic design 11 is shown having two PIs 12 and 13 and two POs 14 and 15. Both POs 14 and 15 are connected to two POs 16 and 17 of wrapper 10. PO 14 is connected to the data input of the level-sensitive latch 18, and PO 15, to the data input of the edge-triggered latch 19. The data output of the level-sensitive latch 18 is PO 16 while the data output of edge-triggered latch 19 is PO 17. The clock inputs of latches 18 and 19 are connected to clock generator 20, which is also attached to logic design 11. Further, a scan control block 21 is connected to logic design 11.

An example of a wrapper for the example macro.vhdl having the file name wrapper_macro.vhdl may be described as follows:

```
-- wrapper_macro.vhdl
library IEEE;
library register;
entity wrapper_macro is port (
   data_in:    in std_ulogic;
   bus_in:     in std_ulogic_vector(0 to 31);
   data_out: out std_ulogic;
   bus_out:    out std_ulogic_vector(0 to 31)
   );
end wrapper_macro;
architecture wrapper_macro of wrapper_macro is
   signal clk:              std_ulogic;
   signal int_clk : std_ulogic;
   signal pre_data_out: std_ulogic;
   signal pre_bus_out:    std_ulogic_vector(0 to 31);
begin
--- instantiation of wrapped macro
i0: entity macro
      port map (
      data_in:    data_in,
      bus_in:     bus_in,
      data_out: pre_data_out,
      bus_out:    pre_bus_out
   );
--- wrapper latches/register ---
reg_0 : entity register.reg_posedge
      generic map (width => 32, offset => 0)
      port map (clk =>    clk,
            data_in => pre_bus_out,
              data_out=> bus_out
            );
reg_1 : entity register.reg_posedge
      generic map (width => 1, offset => 0)
      port map (clk => clk,
            data_in => pre_data_out,
              data_out=> data_out
            );
--- clk generator ---
process (int_clk) is
variable dummy : boolean;
begin
dummy :=true;
         if dummy then
      int_clk <= not int_clk;
   end if;
   end process;
   clk <= int_clk;
   end wrapper_macro;
```

In the preferred embodiment of the present invention, a model checker is advantageously used for verification step 3. An example of such a model checker is described in the tool SixthSense described by H. Mony et al., "Scalable Automated Verification via Expert-System Guided Transformations", Proceedings of Formal Methods in Computer-Aided Design, 5th International Conference, FMCAD 2004. For this tool, a property is specified by the name of a signal in a netlist that needs to always have the value 1 instead of using a formula. This signal name is called a target. Moreover, SixthSense supports an approach for general-purpose sequential redundancy removal, as described by H. Mony et al., in a paper "Exploiting Suspected Redundancy without Proving It", Proceedings of the 2005 Design Automation Conference, pp. 463-466. For this approach, it is not required to use phase-abstraction methods, and it is therefore possible to verify the sequential equivalence of netlists with different types of latches or registers.

Instead of the model checker based on BDDs, other formal verification tools can be used for the functional formal verification with equal success, e.g., the SAT checker. However, since the SAT algorithm needs to enumerate all the solutions one by one, BDD can enumerate them all at once. This consumes significantly less time than by using a model checker.

Besides the FFV tool, a semiformal verification tool or even a simulator or any combination of tools can be used for the verification step 3. For example, in addition to the model checker, SixthSense also provides a SAT checker and allows semiformal searches. The present invention is not limited to the use of netlist representations of digital circuits or HDL implementations. Other representations, such as formulas for the RTL, are also possible.

For designs implemented in VHDL, one may use, e.g., the tool Bugspray, described by H. W. Anderson et al., entitled "Configurable system simulation model build comprising packaging design data", IBM Journal of Research and Development, Vol. 48, No. 3/4, 2004. The design is then implemented as a Bugspray module, for which RTL netlists are created and inserted in the original netlist, resulting in a modified netlist. Although the modifications are performed first at the VHDL language level, the VHDL description of the original netlist does not need changing. SixthSense provides also Bugspray support.

The invention can be combined with other approaches to enable or improve the verification. Examples are methods to reduce the state space for the model checkers, such as phase abstraction and retiming.

This invention is preferably implemented as software, a sequence of machine-readable instructions executing on one or more hardware machines.

While the present invention has been particularly described in conjunction with exemplary embodiments, it is evident that many alternatives, modifications and variations will be apparent to those skilled in the art in light of the present description. It is therefore contemplated that the appended claims will embrace any such alternatives, modifications and variations as falling within the true scope and spirit of the present invention.

The invention claimed is:

1. A method for verifying equivalent logic circuits respectively having different clocking configurations, different types of storage elements, and different descriptive languages, the method comprising:
   a) comparing with a computer a first logic circuit having a first clocking configuration and a first descriptive language against a second logic circuit having a second clocking configuration and a second descriptive language, the first and second logic circuit each having different descriptive languages from each other, and the first and second logic circuit each having different clocking configurations from each other;
   b) based on results of said comparison, creating first and second wrappers respective to said first and second logic circuits, matching said first clocking configuration to said second clocking configuration; and
   c) equalizing said first and second wrappers of said first and second logic circuits, said equalization being performed without affecting the respective storage elements.

2. The method of claim 1, wherein in step a), said clocking configurations are determined by analyzing the first and second clocking configurations of said respective storage elements, wherein said storage elements is determined by selected inputs or selected outputs.

3. The method of claim 1, wherein in step b), said first and second clocking configurations are equalized based on said storage elements ef attached to said clocking configurations.

4. The method of claim 1, wherein in step c) said equalization results in an equivalent offset to timing axes of said inputs and outputs.

5. The method of claim 2, wherein added logic elements are inserted in said logic configurations that are connected to unselected input and outputs.

6. The method of claim 1, wherein in step b), added storage elements are inserted in said first and second logic configurations connected to a subset of said selected inputs and said selected outputs.

7. The method of claim 1, wherein said first and second descriptive languages respectively comprise Verilog and VHDL, or vice versa.

8. The method of claim 1, wherein step c) is performed using a functional formal verification tool.

9. The method of claim 8, wherein said first and second logic configurations are specified in hardware description languages, and wherein the analyzing step is performed in a lexical analysis tool.

10. The method of claim 9, wherein said lexical analysis tool is based on coding conventions.

11. The method of claim 8, wherein said first and second logic configurations are RTL or a gate-level netlist representation of the logic configurations.

12. The method of claim 1, wherein said clocking configurations include clock staging and controls resulting in differences at the inputs and outputs between models of said first and second logic configurations being compared to each other.

13. The method of claim 12, wherein said inputs are selected from a group consisting of clocking control signals, scan-path and scan-path control signals, and reset signals.

14. A non-transitory program storage device readable by a machine, tangibly embodying a program of instructions executable by the machine to perform method steps for verifying equivalent logic circuits having different clocking configurations, different types of storage elements, and different descriptive languages, the program of instructions executable comprising:
  a) comparing with a computer a first logic circuit having a first clocking configuration and a first descriptive language against a second logic circuit having a second clocking configuration and a second descriptive language, the first and second logic circuit each having different descriptive languages from each other, and the first and second logic circuit each having different clocking configurations from each other;
  b) based on results of said comparison, creating first and second customized wrappers to said respective first and second logic circuits to match said first clocking configuration to said second clocking configuration; and
  c) equalizing said customized wrappers of said first and second logic circuits, said equalization being performed without affecting the respective storage elements.

15. The non-transitory program storage device of claim 14, wherein the comparing step is performed by a tool selected from a group consisting of a checker, a semiformal verification tool, a simulation tool, and any combination thereof.

* * * * *